US011303064B2

(12) United States Patent
Pan et al.

(10) Patent No.: US 11,303,064 B2
(45) Date of Patent: Apr. 12, 2022

(54) METHODS AND APPARATUSES FOR ALIGNING AND COUPLING A CIRCUIT BOARD WITH A CHASSIS AND ANOTHER CIRCUIT BOARD

(71) Applicant: Beijing Voyager Technology Co., Ltd., Beijing (CN)

(72) Inventors: Anan Pan, Fremont, CA (US); Henghui Jiang, Newark, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 0 days.

(21) Appl. No.: 16/926,435

(22) Filed: Jul. 10, 2020

(65) Prior Publication Data
US 2022/0013957 A1   Jan. 13, 2022

(51) Int. Cl.
| | |
|---|---|
| *H01R 12/00* | (2006.01) |
| *H01R 13/631* | (2006.01) |
| *H01R 43/26* | (2006.01) |
| *H05K 1/18* | (2006.01) |
| *H01R 12/71* | (2011.01) |
| *G01S 7/481* | (2006.01) |
| *H01R 13/639* | (2006.01) |
| *H01R 13/621* | (2006.01) |

(52) U.S. Cl.
CPC ............ *H01R 13/631* (2013.01); *G01S 7/481* (2013.01); *H01R 12/716* (2013.01); *H01R 13/639* (2013.01); *H01R 43/26* (2013.01); *H05K 1/18* (2013.01); *H01R 13/621* (2013.01); *H01R 2201/20* (2013.01); *H05K 2201/09063* (2013.01); *H05K 2201/10189* (2013.01)

(58) Field of Classification Search
CPC .. H01R 12/716; H01R 13/631; H01R 13/639; H01R 13/621; H01R 43/26; H01R 2201/20; G01S 7/481; H05K 1/18; H05K 2201/09063; H05K 2201/10189
USPC .......................................................... 439/74
See application file for complete search history.

(56) References Cited

U.S. PATENT DOCUMENTS

| | | | | | |
|---|---|---|---|---|---|
| 3,459,998 | A | * | 8/1969 | Focarile ................. | H05K 1/144 361/690 |
| 4,929,185 | A | * | 5/1990 | Wong ..................... | F16B 35/041 361/810 |
| 5,272,599 | A | * | 12/1993 | Koenen .............. | H05K 7/20445 165/185 |

(Continued)

*Primary Examiner* — Abdullah A Riyami
*Assistant Examiner* — Vladimir Imas
(74) *Attorney, Agent, or Firm* — Kilpatrick Townsend & Stockton LLP

(57) ABSTRACT

A Light Detection and Ranging (LiDAR) module for a vehicle can include a chassis, a galvanometer driver circuit board and a main circuit board. The main circuit board may be pre-assembled to the chassis resulting in a blind mating of an electrical connector of the main circuit board to an electrical connector of the galvanometer driver circuit board. The LiDAR module may include pins extending from the chassis arranged to extend through holes in the galvanometer driver circuit board in order to align the electrical connector of the galvanometer driver circuit board with the electrical connector of the main circuit board prior to the coupling of the electrical connectors. The pin may include a threaded portion coupled to the chassis, an unthreaded central portion engaging the galvanometer driver circuit board, and another threaded portion used to secure the galvanometer driver circuit board to the chassis.

18 Claims, 9 Drawing Sheets

(56) References Cited

U.S. PATENT DOCUMENTS

| | | | | |
|---|---|---|---|---|
| 5,536,177 A * | 7/1996 | Casey | H05K 7/023 | 439/74 |
| 5,575,686 A * | 11/1996 | Noschese | H01R 23/68 | 439/620.21 |
| 5,602,723 A * | 2/1997 | Takahashi | H05K 7/1422 | 257/659 |
| 5,793,034 A * | 8/1998 | Wesolowicz | G01S 7/499 | 250/216 |
| 6,144,557 A * | 11/2000 | Chen | H05K 1/141 | 174/548 |
| 6,222,741 B1 * | 4/2001 | Drennen | H05K 1/021 | 361/706 |
| 6,431,879 B2 * | 8/2002 | Brekosky | H05K 7/142 | 361/804 |
| 6,535,386 B2 * | 3/2003 | Sathe | H01L 23/4006 | 361/700 |
| 6,617,523 B1 * | 9/2003 | McClain | H05K 7/1431 | 174/260 |
| 6,692,310 B2 * | 2/2004 | Zaderej | H01R 13/514 | 439/541.5 |
| 6,711,030 B2 * | 3/2004 | Akiba | H05K 3/368 | 174/262 |
| 7,223,106 B2 * | 5/2007 | Nakajima | H01R 13/6215 | 411/178 |
| 7,227,761 B2 * | 6/2007 | Estes | H05K 7/142 | 174/138 D |
| 7,432,702 B2 * | 10/2008 | Shiao | H05K 1/144 | 324/756.07 |
| 7,609,530 B2 * | 10/2009 | Snider | H05K 9/003 | 174/350 |
| 7,658,621 B2 * | 2/2010 | Brown | H01R 12/52 | 439/74 |
| 8,041,483 B2 * | 10/2011 | Breed | B60R 21/0134 | 701/46 |
| 8,128,419 B2 * | 3/2012 | Nijhuis | H04Q 1/142 | 439/76.1 |
| 8,351,211 B2 * | 1/2013 | Maeda | H05K 7/20509 | 361/752 |
| 9,194,415 B2 * | 11/2015 | Ou | F16B 9/054 | |
| 9,414,480 B2 * | 8/2016 | Lu | H05K 7/20181 | |
| 9,857,398 B2 * | 1/2018 | Meng | G01R 19/0092 | |
| 10,181,665 B2 * | 1/2019 | Ooshiro | H01R 12/7047 | |

* cited by examiner

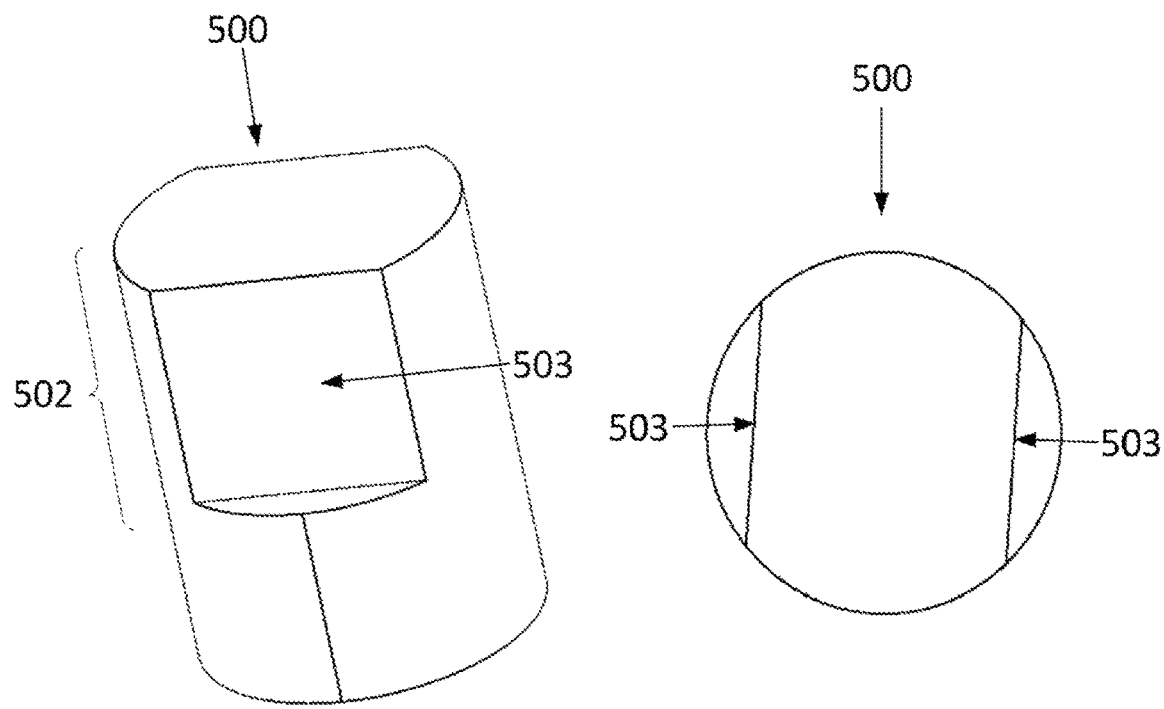
FIG. 5A
FIG. 5B
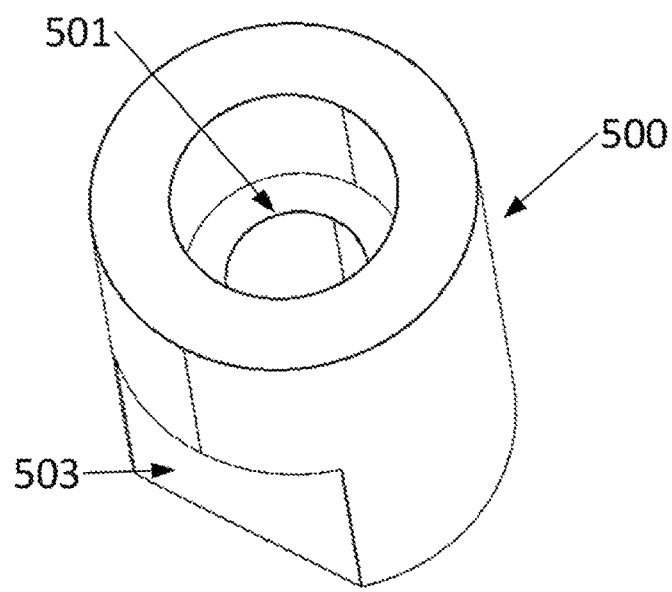
FIG. 5C

METHODS AND APPARATUSES FOR ALIGNING AND COUPLING A CIRCUIT BOARD WITH A CHASSIS AND ANOTHER CIRCUIT BOARD

BACKGROUND

Light detection and ranging (LiDAR) systems are used for autonomous vehicles. A LiDAR system comprises multiple sensors and emitters, including electric and mechanical components, for example galvanometers. The components are coupled to circuitry comprising one or more circuit boards. Multiple circuit boards are coupled together to increase computing density. A LiDAR system may include a main circuit board and a plurality of additional circuit boards coupled to the main circuit board.

BRIEF SUMMARY

In embodiments, a first circuit board of a LiDAR assembly may be coupled to a chassis and to a second circuit board of the LiDAR assembly. The second circuit board may be coupled to the chassis prior to coupling the first circuit board to the chassis and to the second circuit board. In embodiments, the first circuit board may be positioned over the chassis so that a first pin of one or more pins extending from the chassis extends into a first through hole of the first circuit board, and a first electrical connector of the first circuit board may contact and couple to a second electrical connector of the second circuit board. The first pin may be received into the first through hole prior to the first electrical connector contacting the second electrical connector in order to cause alignment of the first electrical connector and the second electrical connector prior to the coupling of the first electrical connector to the second electrical connector.

In embodiments, the first circuit board may be a galvanometer driver circuit board configured to control a galvanometer of the LiDAR assembly. In embodiments, the first connector or the second connector may be a header socket. In embodiments, coupling the first circuit board to the chassis and to the second circuit board may include positioning the first circuit board over the chassis so that a second pin of the one or more pins extending from the chassis extends into a second through hole of the first circuit board to further cause the alignment of the first electrical connector and the second electrical connector prior to the coupling of the first electrical connector to the second electrical connector.

In embodiments, coupling the first circuit board to the chassis and to the second circuit board may include securing the first circuit board to the chassis with a screw extending through a third through hole of the first circuit board into the chassis, after the first electrical connector is coupled to the second electrical connector. In embodiments, the chassis may define a first side, a second side, and an opening between the first side and the second side, the first side of the chassis may face the first circuit board, the second side of the chassis may face the second circuit board, and the second electrical connector may not extend past the first side. In embodiments, the chassis may define a recessed surface offset from the first side, and the one or more pins may extend from the recessed surface and extend past the first side.

In embodiments, the first pin may include a threaded chassis end, and coupling the first circuit board to the chassis and to the second circuit board may include threadedly coupling the threaded chassis end of the first pin to the chassis prior to positioning the first circuit board. In embodiments, the first pin may include a threaded securing end, opposite the threaded chassis end, and coupling the first circuit board to the chassis and to the second circuit board may include threadedly coupling a first pin cap to the threaded securing end of the first pin to secure the first circuit board between the pin cap and the chassis. In embodiments, the first pin includes an unthreaded central portion between the threaded securing end and the threaded chassis end, the unthreaded central portion defines a flattened circular cross-section, a perimeter of the flattened circular cross-section includes two straight sides and two arced sides, and the two arced sides are respectively defined by a first radius corresponding to a second radius of the first through hole of the first circuit board so that when engaged with each other the unthreaded central portion limits movement of the first circuit board relative to the first pin in directions perpendicular to a longitudinal axis of the first pin.

In embodiments, a LiDAR assembly includes a chassis, a first circuit board including a first electrical connector and a first through hole, and a second circuit board coupled to the chassis including a second electrical connector coupled to the first electrical connector. The LiDAR assembly may further include a first pin extending from the chassis through the first through hole of the first circuit board. In embodiments, the first pin is configured to be received into the first through hole prior to the first electrical connector being coupled to the second electrical connector in order to cause alignment of the first electrical connector and the second electrical connector prior to the coupling of the first electrical connector to the second electrical connector.

In embodiments, the first circuit board may be a galvanometer driver circuit board configured to control a galvanometer of the LiDAR assembly. The first connector or the second connector may be a header socket. In embodiments, the LiDAR assembly includes a second pin extending from the chassis through a second through hole of the first circuit board. The first pin and the second pin may be configured to be received into the first through hole and the second through hole, respectively, prior to the first electrical connector being coupled to the second electrical connector in order to cause alignment of the first electrical connector and the second electrical connector prior to the coupling of the first electrical connector to the second electrical connector. In embodiments, the LiDAR assembly may include a screw extending through a third through hole of the first circuit board into the chassis. In embodiments, the chassis may define a first side, a second side, and an opening between the first side and the second side. In embodiments, the first side of the chassis may faces the first circuit board, the second side of the chassis may face the second circuit board, and the second electrical connector may not extend past the first side. In embodiments, the chassis may define a recessed surface offset from the first side, and the one or more pins may extend from the recessed surface and extend past the first side. In embodiments, the first pin may include a threaded chassis end, and the threaded chassis end of the first pin may be configured to be threadedly coupled to the chassis prior to the first circuit board being supported by the recessed surface. In embodiments, the first pin may include a threaded securing end, opposite the threaded chassis end, and the pin cap may be threadedly coupled to the securing end of the first pin in order to secure the first circuit board between the pin cap and the chassis. In embodiments, the first pin may include an unthreaded central portion between the threaded securing end and the threaded chassis end, the unthreaded central portion may define a flattened circular cross-section, a perimeter of the flattened circular cross-section may include two straight sides and two arced sides, and the two arced sides may be respectively defined by a first radius corresponding to a second radius of the first through hole of the first circuit board so that when engaged with each other the unthreaded central portion limits movement of the first circuit board relative to the first pin in directions perpendicular to a longitudinal axis of the first pin.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which:

FIGS. 5A-5C show views of a pin cap of a LiDAR assembly, according to certain embodiments.

Throughout the drawings, it should be noted that like reference numbers are typically used to depict the same or similar elements, features, and structures.

DETAILED DESCRIPTION

Aspects of the present disclosure relate generally to coupling a first circuit board to a chassis and second circuit board. The first circuit board, second circuit board and chassis may be part of a LiDAR assembly, according to certain embodiments.

In the following description, various examples of circuit board coupling techniques are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high-level summary is intended to provide a basic understanding of some of the novel innovations depicted in the figures and presented in the corresponding descriptions provided below. Generally, aspects of the invention are directed to implementations of a coupling of a first circuit board to a second circuit board and a chassis. For example, a Light Detection and Ranging (LiDAR) module of an autonomous vehicle may include a chassis to which a plurality of circuit boards and sensors, including electro-mechanical sensors, for example galvanometers, are attached. A first circuit board may be a galvanometer driver circuit board used to produce signals to drive the movements of a mirror of the galvanometer. A second circuit board may be a main circuit board to which all other circuit boards and/or sensors are either directly or indirectly electronically coupled. The main circuit board may be coupled to the chassis prior to other components being coupled to the chassis. Due to structural features of the chassis, electrical connectors of the main circuit board may be partially or fully obscured to an installer during coupling of another circuit board's electrical connector to the electrical connector of the main board, which may be referred to as "blind mating". Blind mating may lead to increased assembly time and costs due to prolonged or multiple attempts to couple the electrical connectors and/or damage to the electrical connectors during the blind mating.

Figure 1A:
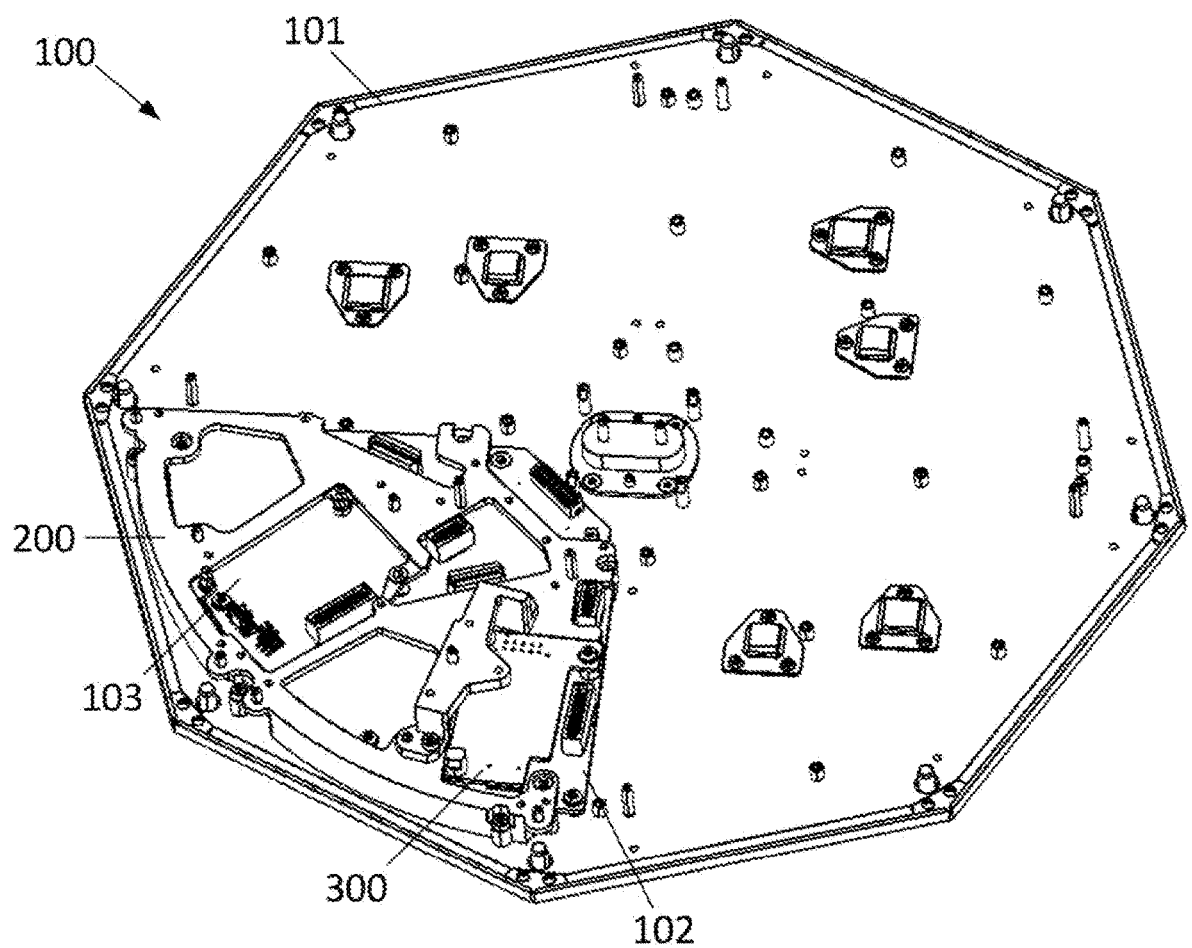
FIG. 1A shows a portion of an autonomous vehicle LiDAR assembly including a first circuit board, a second circuit board and a chassis, according to certain embodiments.

The present technology relates to the use of pins, specifically partially threaded pins, during the blind mating of two circuit boards in order to pre-align the electrical connectors of the two circuit boards prior to the electrical connectors being coupled together. Specifically, the chassis includes a recess for receiving a first circuit board on a first side, opposite a second side to which a second circuit board, the main circuit board, is coupled, for example as shown in FIG. 1A. One or more partially threaded pins are coupled to the chassis and extend from the recess. The one or more pins are arranged to correspond to an arrangement of corresponding through holes of the first circuit board so that positioning the pins within the through holes of the first circuit board causes an electrical connector of the first circuit to align for coupling with an electrical connector of the main circuit board. With the one or more pins positioned within the through holes, the electrical connector of the first board may be coupled to the electrical connector of the second board without visually observing the first and second electrical connectors, as shown for example in FIGS. 6A-6F. The figures are further described in greater detail below and the scope of the various embodiments of the present invention are not limited by this summary, which merely operates to present a high-level understanding of some of the novel concepts that follow.

FIG. 1A shows a portion of an autonomous vehicle LiDAR assembly 100. As shown, the LiDAR assembly 100 comprises a base plate 101, a chassis 200, a main circuit board 102, and a first circuit board 300. The main circuit board 102 may be coupled to the base plate 100 and/or the chassis 200 so that the main circuit board 102 is positioned between the base plate 101 and the chassis 200. The first circuit board 300 is coupled to the chassis 200 and electrically coupled via electrical connectors to the main circuit board 102. In embodiments, multiple other circuit boards 103, in addition to the first circuit board 300, may be coupled to the chassis 200 and electrically coupled via electrical connectors to the main circuit board 102 in the same or similar manner as the first circuit board 300. Additional components of the LIDAR assembly, for example components of transmission (TX) and receiving (RX) modules, may be coupled to the base plate 101 and/or chassis 200, and may be electrically coupled to one or more main circuit boards 102, first circuit boards 300, and/or other circuit boards 103.

Figure 1B:
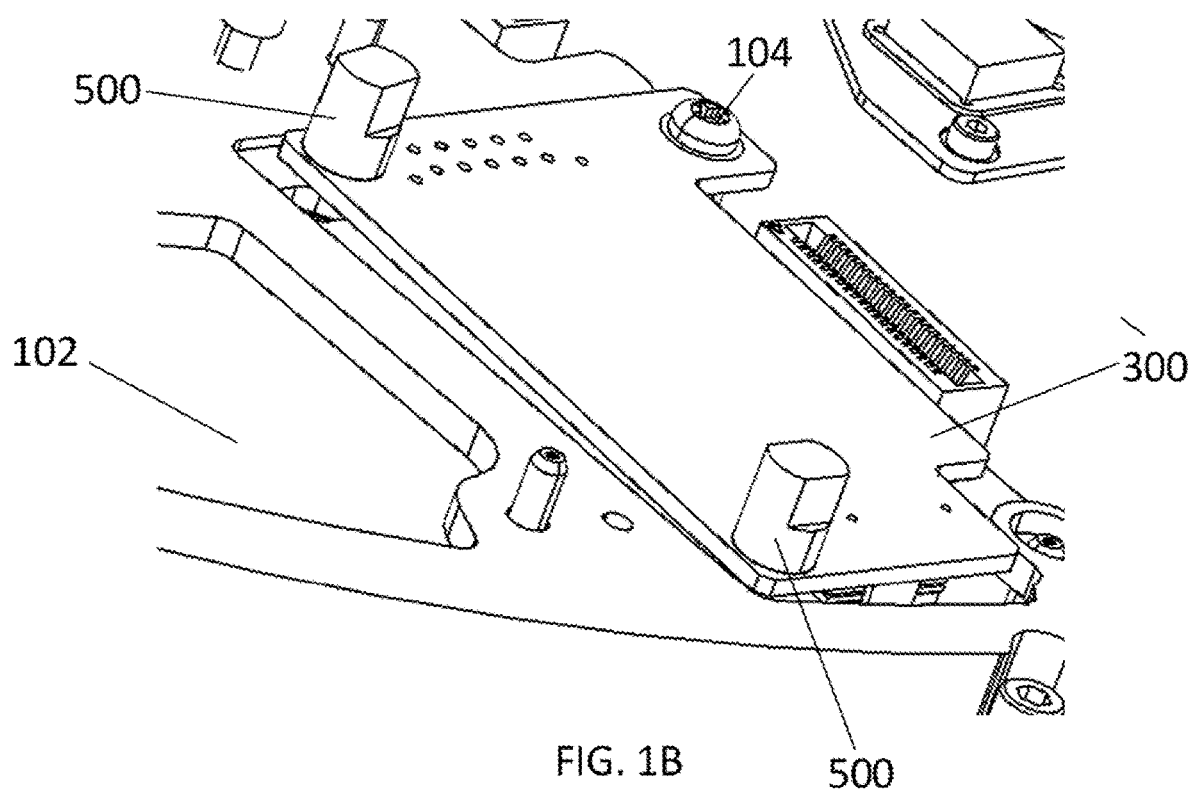
FIG. 1B shows another view of a portion of an autonomous vehicle LiDAR assembly including a first circuit board, a second circuit board and a chassis, according to certain embodiments.
Figure 1C:
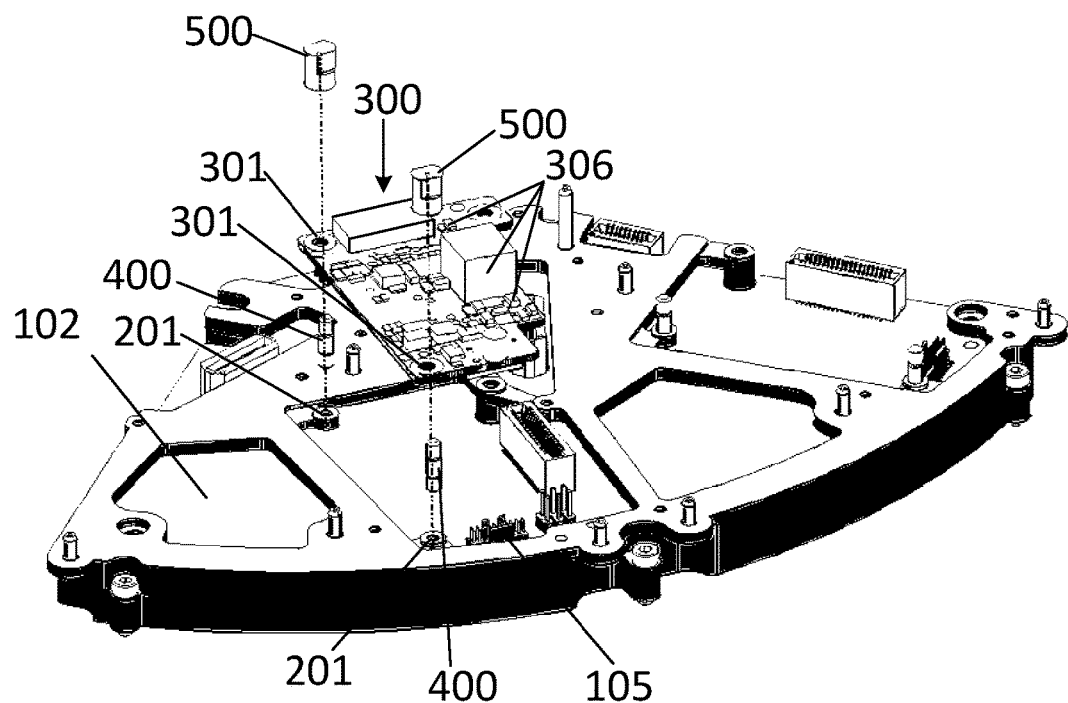
FIG. 1C shows an exploded view of an assembly including a first circuit board, a second circuit board and a chassis, according to certain embodiments.

FIG. 1B shows a portion of the LiDAR assembly 100 of FIG. 1A, including the chassis 200 and the first circuit board 300. As shown in FIG. 1B, the first circuit board 300 may be coupled to the chassis 200 with pin caps 500 and a screw 104. FIG. 1C shows an exploded view of a sub-assembly of the LiDAR assembly 100 comprising the main circuit board 102, the first circuit board 300, partially threaded pins 400, and pin caps 500. The partially threaded pins 400, which may also be referred to as pins, are threadedly received in holes 201 of the chassis 200 and extend into through holes 301 of the first circuit board 300. As shown in FIG. 1B, pin caps 500 threadedly couple to the partially threaded pins 400 in order to secure the first circuit board 300 to the chassis 200.

As shown in FIG. 1C, the main circuit includes an electrical connector 105. As shown, in embodiments, the electrical connector 105 may be a male pin header. In, embodiments, the electrical connector 105 may be a female pin header socket or other types of electrical connectors. The electrical connector 105 is electrically coupled with a corresponding electrical connector of another component of the LiDAR assembly, for example the electrical connector 305 of the first circuit board 300. The distance of translation from a point where portions of electrical connectors initially contact or overlap to a point where the electrical connectors are fully coupled may be referred to as the "coupling distance".

Figure 2A:
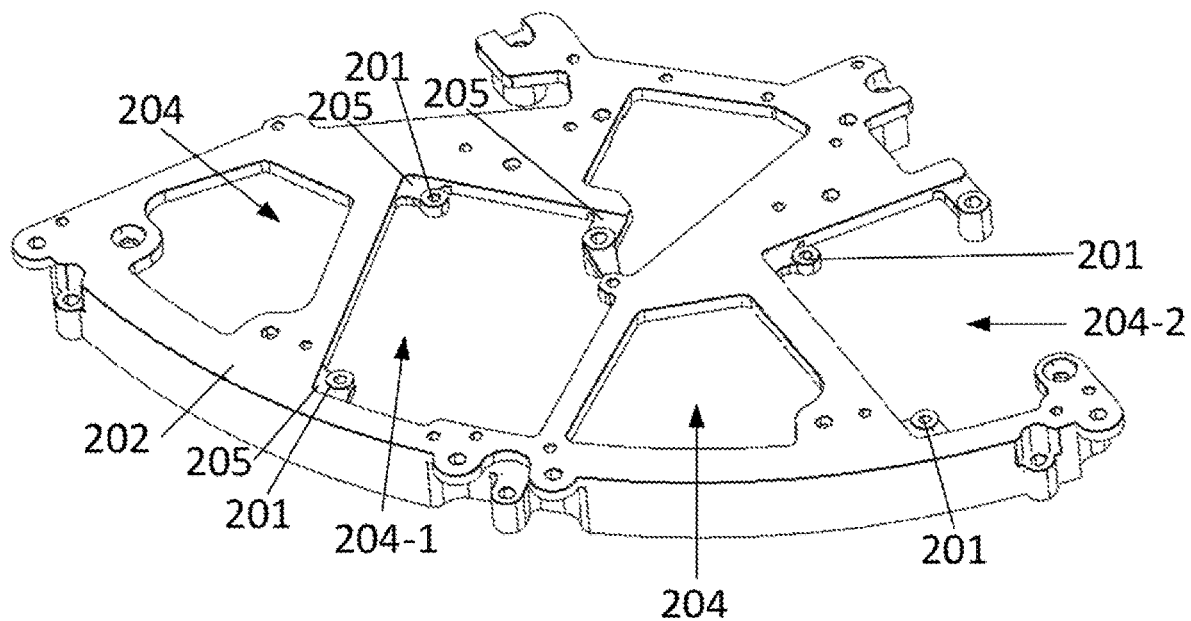
FIGS. 2A and 2B show views of a chassis of a LiDAR assembly, according to certain embodiments.
Figure 2B:
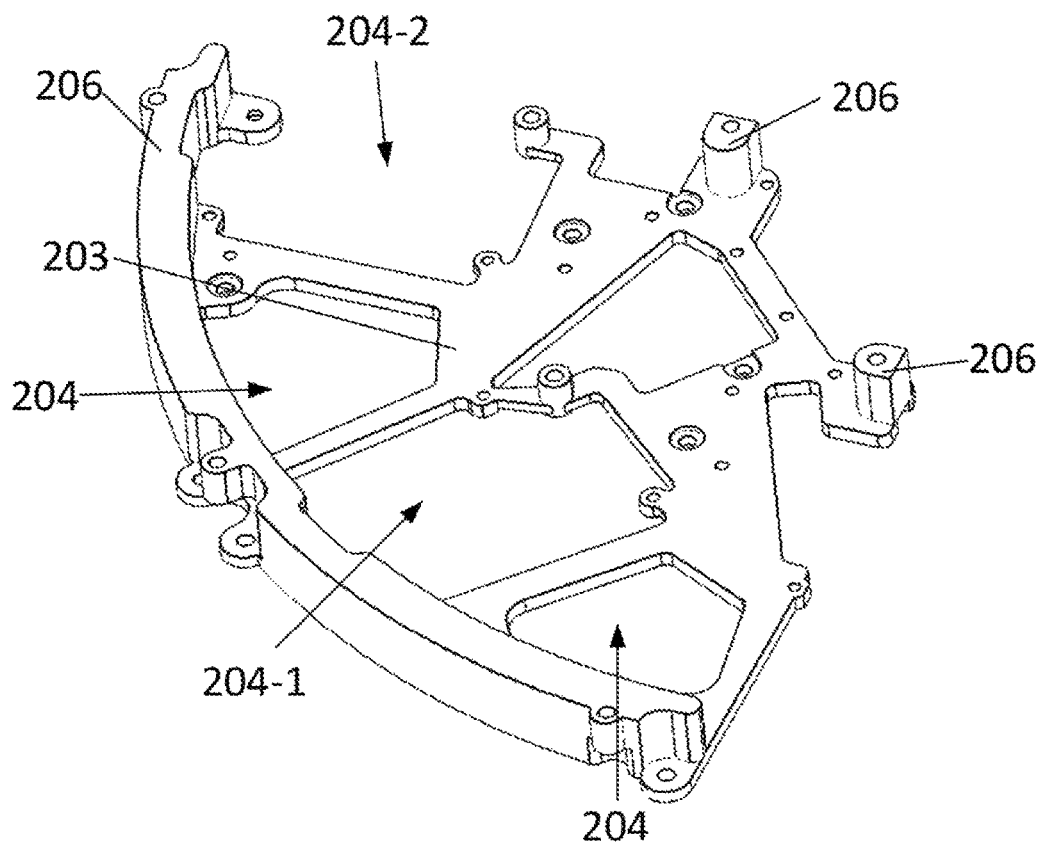

In embodiments, for example as shown in FIGS. 2A and 2B, the chassis 200 comprises a planar body comprising a first side 202, as shown in FIG. 2A, and a second side 203, as shown in FIG. 2B. The chassis 200 may be coupled to the base plate 101 so that the second side 203 faces the base plates, for example as shown in FIG. 1A.

As shown, the planar body of the chassis 200 defines a plurality of openings 204. The openings 204 allow for electrical connections to be made between components coupled to the first side 202 and components coupled to the second side 203. The openings 204 further provide a space for components populating the board portion of the circuit boards to be positioned, for example the electrical connector 105 shown in FIG. 1C, which is fully within a recess defined within an opening 204 between the board portion of the main circuit board 102 and the first side 202 of the chassis 200, so that the electrical connector 105 does not extend past the first side 202.

The openings 204 may fully or partially define recesses for receiving components to be mounted to the chassis 200. In embodiments, the openings 204 may be surrounded on all sides by portions of the chassis 200, for example opening 204-1, or may be surrounded only partially by portions of the chassis 200, for example opening 204-2.

As shown in FIG. 2A, the chassis 200 may include recessed surfaces 205 offset from the first side 202. Recessed surfaces 205 may be located around the perimeters of the openings 204. Recessed surfaces 205 around the perimeter of an opening 204 may be continuous or segmented comprising multiple distinct portions, for example as shown in FIG. 2A. The openings 204 and recessed surfaces 205 may define recesses shaped and sized to receive the first circuit board 300 or other circuit boards 103, for example as shown in FIG. 1A, wherein the circuit boards are supported on the recessed surfaces. The recessed surfaces 205 may include holes 201 for receiving threaded pins and/or screws for securing a circuit board within the recess.

The chassis 200 may further comprise riser portions 206 extending from the second side 203, for example as shown in FIG. 2B. The riser portions 206 contact the base plate 101 and support the second side 203 apart from the base plate 101 to define a cavity where the main circuit board 102 is positioned. The main circuit board 102 may be positioned in the cavity under a plurality of the openings 204 so that a plurality of electrical connections can be made to the circuit board through different openings 204.

The chassis 200 may be constructed out of a rigid material, for example aluminum, in order to provide support and maintain alignment, for example optical alignment, of the LiDAR components coupled to the chassis 200. The chassis may further dissipate heat generated by the components coupled to the chassis.

FIGS. 3A-3D show an embodiment of a first circuit board 300. The first circuit board 300 may include a board portion 302. The board portion 302 may comprise one or more layers of dielectric material, and a plurality of conductive traces. The board portion is populated with an electrical connector 305. The board portion 302 may also be populated with other electrical components 306 as shown in FIG. 1C, for example but not limited to: resistors, transistors, capacitors, inductors, diodes, microcontrollers. The other electrical components 306 are omitted for clarity purposes in figures other than FIG. 1C.

Figure 3A:
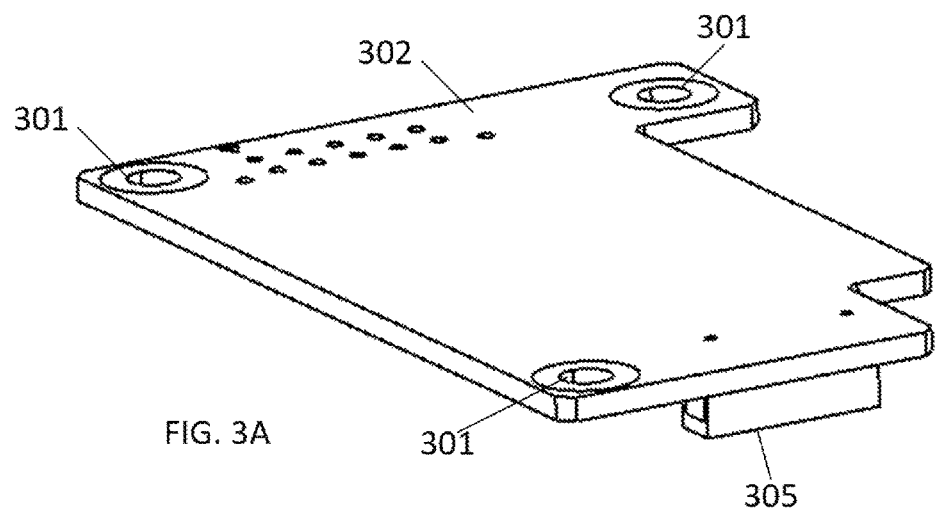
FIGS. 3A-3D show views of a first circuit board of a LiDAR assembly, according to certain embodiments.
Figure 3B:
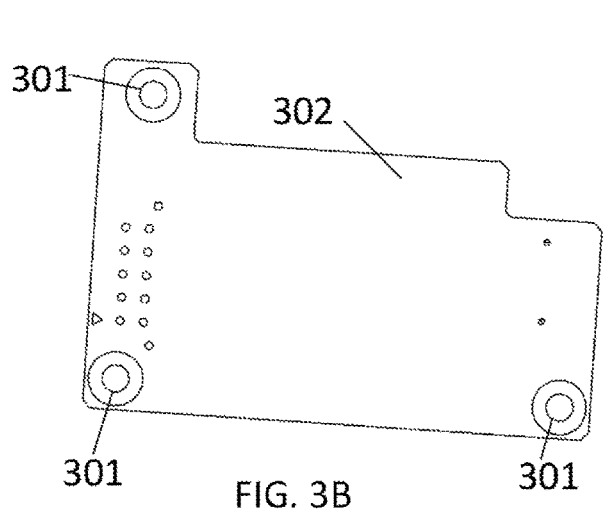
Figure 3C:
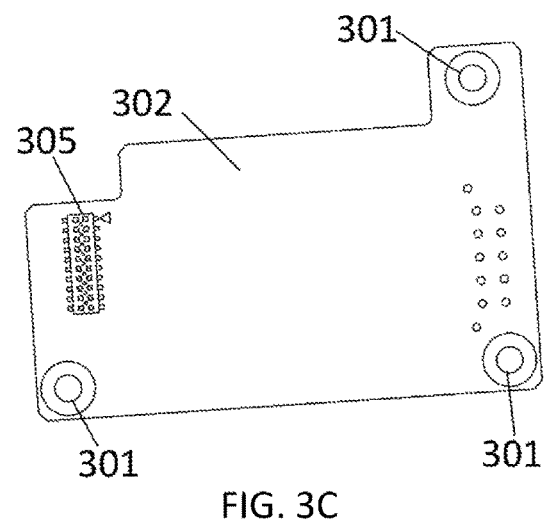
Figure 3D:
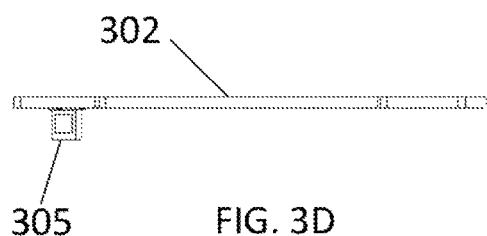

As shown in FIGS. 3A-3C, the board portion 302 comprises a plurality of through holes 301. A first circuit board 300 may include any number of through holes 301, for example 1, 2, 3, 4, 5 or more. The mounting holes may be circular, as shown in FIG. 3B, or may be other shapes.

Figure 4A:
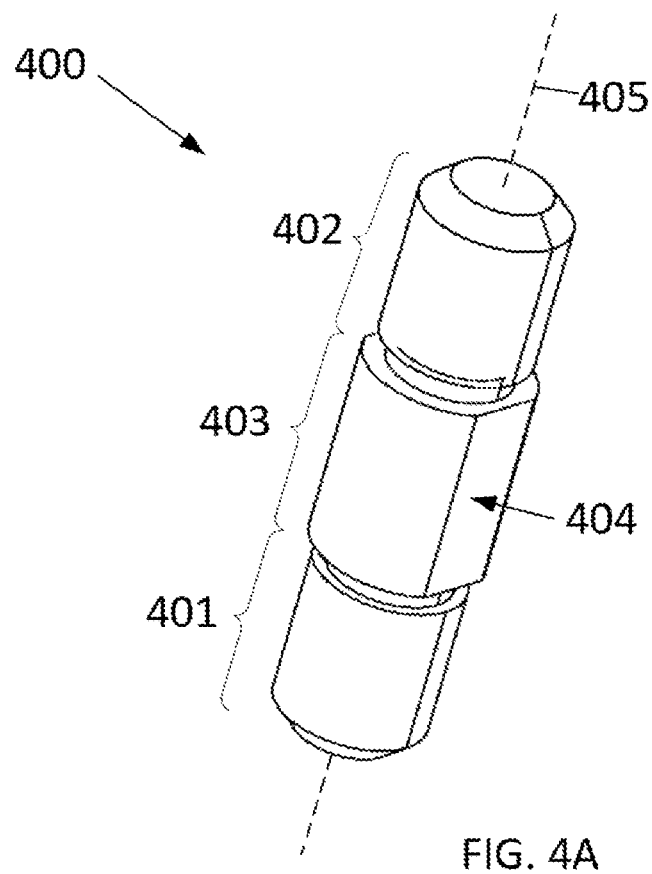
FIGS. 4A and 4B show views of a partially threaded pin of a LiDAR assembly, according to certain embodiments.
Figure 4B:
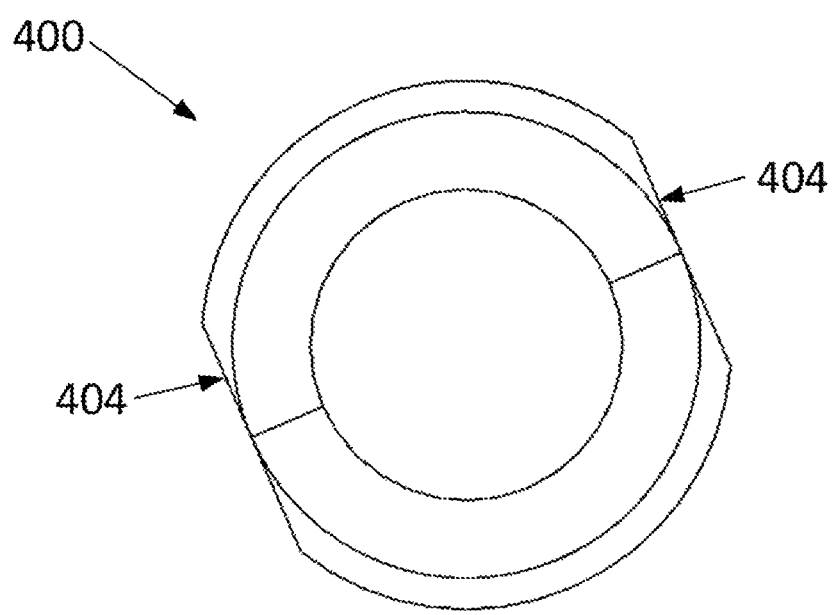

FIGS. 4A and 4B show an embodiment of a partially threaded pin 400. As shown, in embodiments, a partially threaded pin 400 comprises an elongate body with a threaded chassis end 401, a threaded securing end 402, and an unthreaded central portion 403 between the threaded chassis end 401 and threaded securing end 402. The threaded chassis end 401 and the threaded securing end 402 define threaded surfaces complementary to the threading of the through holes 301 and pin cap 500, respectively. For clarity purposes, visual details of the threading are omitted from the figures.

The threaded ends have circular cross-sections. The threaded chassis end 401 and the threaded securing end 402 may have the same diameter and pitch or may have different diameters and/or pitches.

The unthreaded central portion 403 may have a circular cross-section. The central portion 403 may have flattened surface portions 404 so that the circular cross-section includes straight portions and arced portions. The flattened surface portions 404 may be used to allow a user to engage the pin with a tool to rotate the pin in order to threadedly couple the partially threaded pin 400 in the holes 201 of the chassis 200.

As shown in FIG. 4B, the cross-section of the securing end 402 may not extend beyond the cross-section of the central portion 403 so that a hole 301 of the first circuit board 300 may pass over the securing end 402 onto the central portion 403. The size and shape of the central portion cross-section may correspond to the size and shape of the holes 201 of the chassis 200. For example, the radius of the circular cross-section of the pin 400 may be the same or substantially the same as the radius of the through hole 301 so that the central portion 403 of the pin 400 is restrained in the hole 201 except for translation in a direction along the longitudinal axis 405 of the pin and rotation around the longitudinal axis 405 of the pin 400. The length of the central portion 403 and securing end 402 may be longer than the coupling distance of the electrical connectors 105 and 305.

FIGS. 5A-5C show an embodiment of a pin cap 500. As shown, in embodiments, a pin cap 500 comprises a threaded hole 501 and a securing end 502. The threaded hole 501 comprises a female threaded surface corresponding to the threading of the securing end 402 of the partially threaded pin 400. The securing end comprises flat surface 503 to be engaged by a tool, for example a wrench, in order to rotate the pin cap 500 to threadedly couple to the partially threaded pin 400.

The chassis 200, partially threaded pins 400 and pin caps 500 may be used for the blinding mating of a first electrical connector of a first circuit board, for example electrical connector 305 of first circuit board 300, to a second electrical connector of a second circuit board, for example, electrical connector 105 of the main circuit board 102, as shown for example in FIGS. 6A-6F.

Figure 6A:
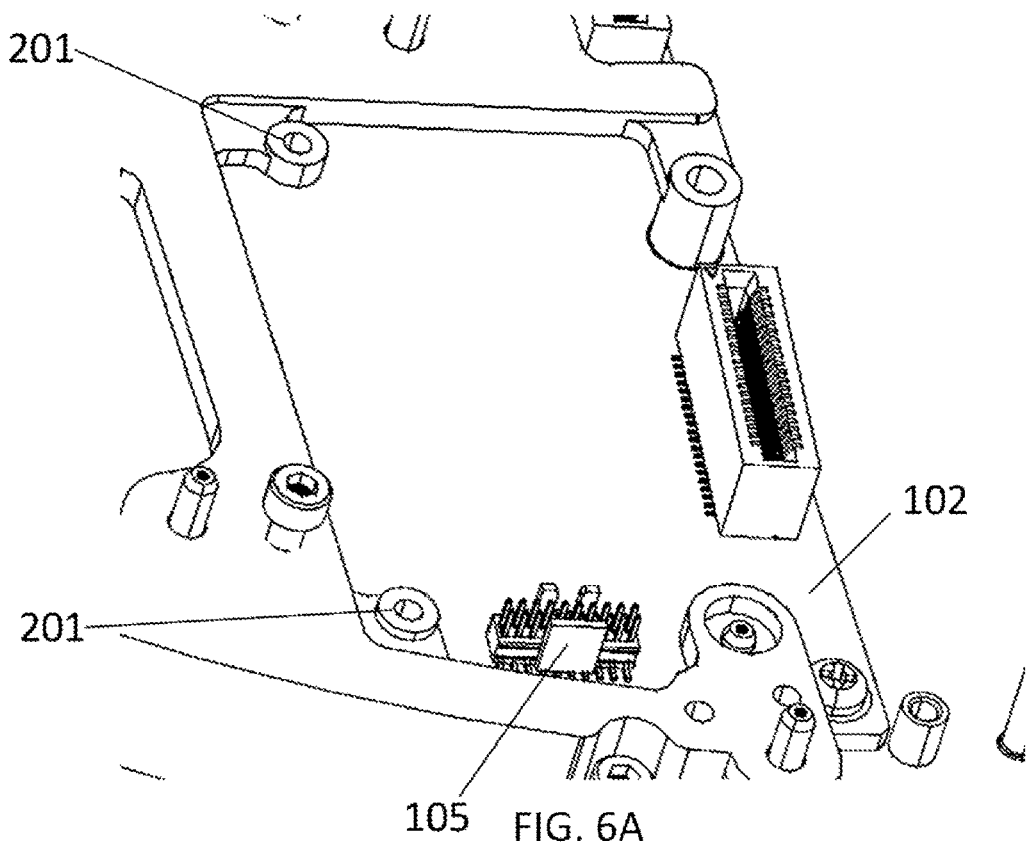
FIGS. 6A-6F show steps of aligning and coupling a first circuit board to a chassis and second circuit board of a LiDAR assembly, according to certain embodiments.

As shown in FIG. 6A, the main circuit board 102 may be pre-coupled to the chassis 200 so that the electrical connector 105 is within an opening 204 of the chassis 200. In the embodiment shown, the recessed surface 205 comprises three portions, however, in embodiments the recessed surface may have any number of portions. The electrical connector 105 of the main circuit board 102 is below the first side 212 of the chassis 200, and therefore portions of the chassis 200 in combination with the first circuit board 300 will at least partially obscure a user from viewing the electrical connectors 105 and 305 during coupling and therefore the coupling will be a blind mating.

Figure 6B:
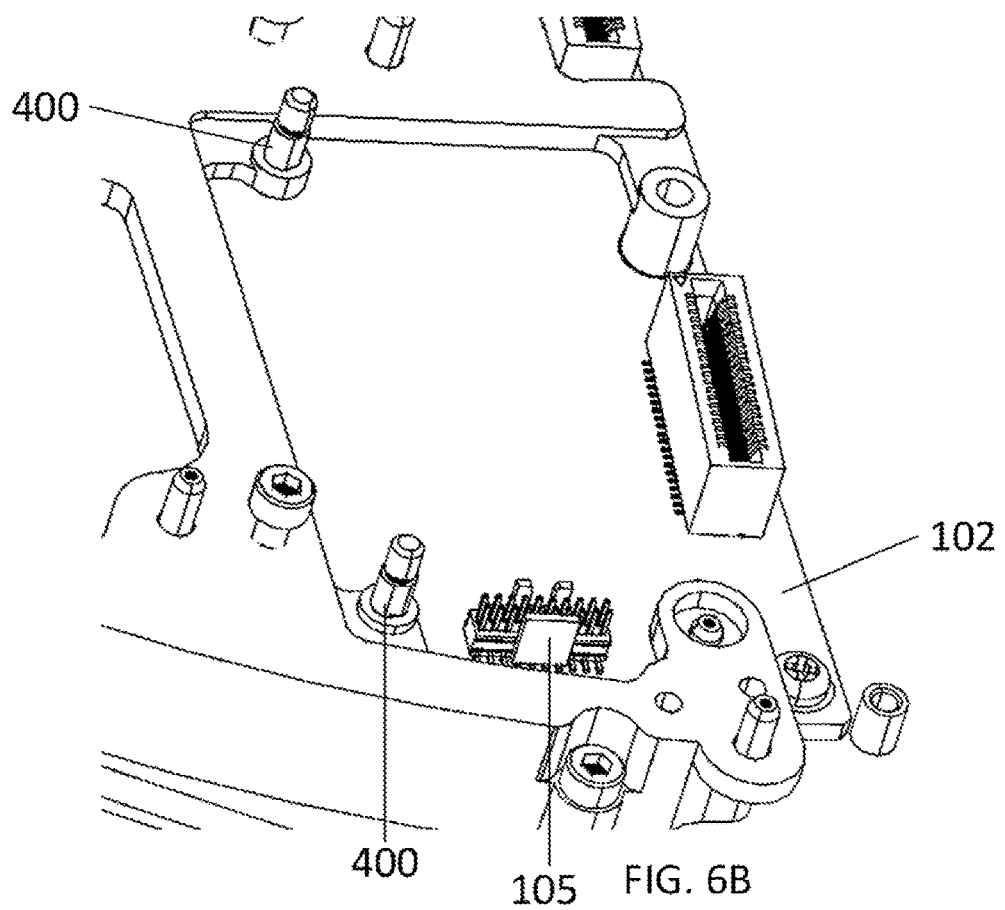

FIG. 6B shows a step of threadedly connecting partially threaded pins 400 to two holes 201 on the recessed surface 205. In embodiments, other numbers of pins may be used, for example one or three pins. As shown the partially threaded pins 400 extend from the recessed surface 205 past the first side 202. The length of exposed portion of the pin, comprising the central portion 403 and the securing end 402 is longer than a coupling distance of the electrical connectors 105 and 305.

Figure 6C:
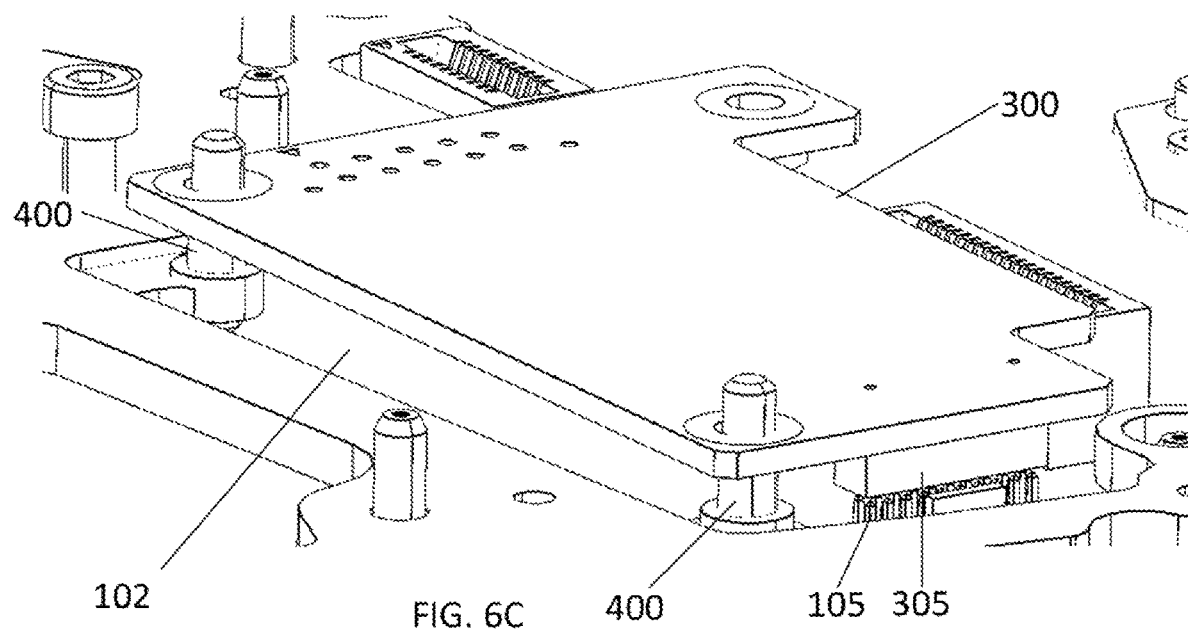

FIG. 6C shows a step of positioning the partially threaded pins 400 within the through holes 301 of the first circuit board 300. As shown, with the exposed portions of the partially threaded pins 400 being longer than the coupling distance of the electrical connectors 105 and 305 the partially threaded pins 400 may extend partially into the through holes 301 without the electrical connector 105 overlapping or contacting the electrical connector 305. With the two partially threaded pins 400, as shown in FIG. 6C, the first circuit board 300 is restrained in 5 of the 6 degrees of freedom, all but translation in a direction of the longitudinal axis 405 is restrained. The holes 201 and 301 are arranged so that with the pins 400 within through holes 301 the electrical connector 305 is aligned over electrical connector 105, and therefore the blind mating can occur without direct visualization of the electrical connectors 105 and 305.

Figure 6D:
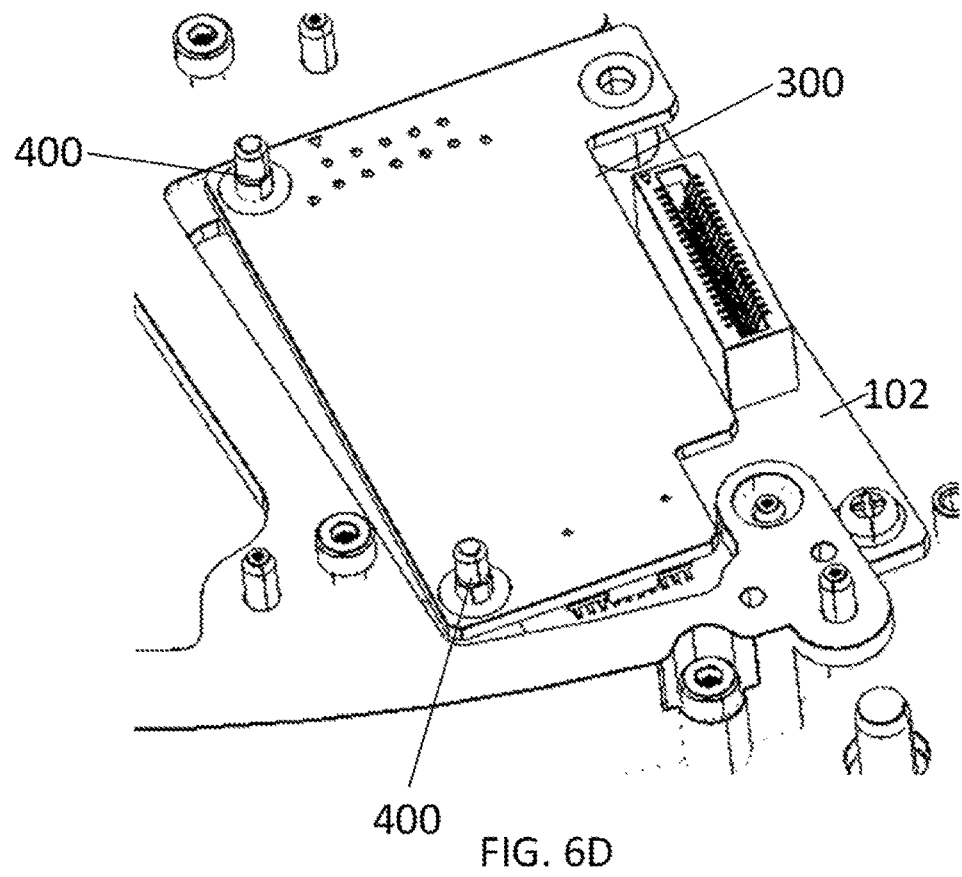

FIG. 6D shows a step of translating the first circuit board 300 toward the recessed surface 205, so that the first circuit board 300 is supported by the recessed surface 205. The depth of the recessed surface 205 may be set so that in the position shown in FIG. 6D the electrical connectors 105 and 305 are fully engaged and coupled. For example, in embodiments, the header pins of electrical connector 105 are fully within header sockets of electrical connector 305. Further, the electrical connectors 105 and 305 may have complementary clips which may engage when the electrical connectors are fully coupled in order to prevent unintentional uncoupling.

Figure 6E:
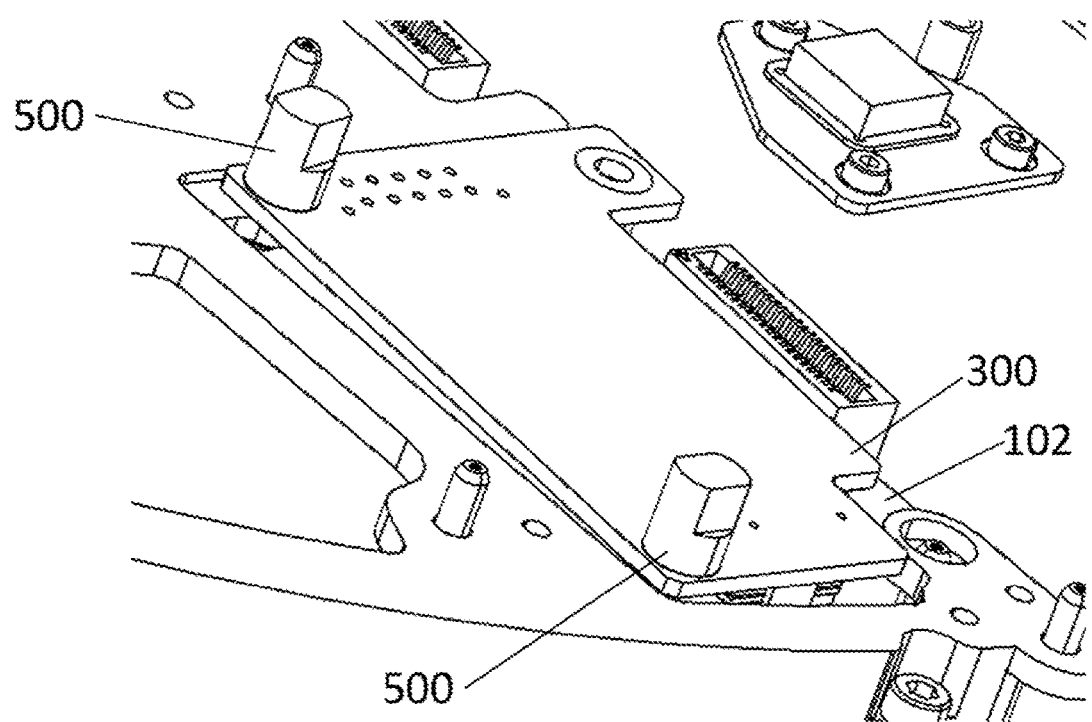
Figure 6F:
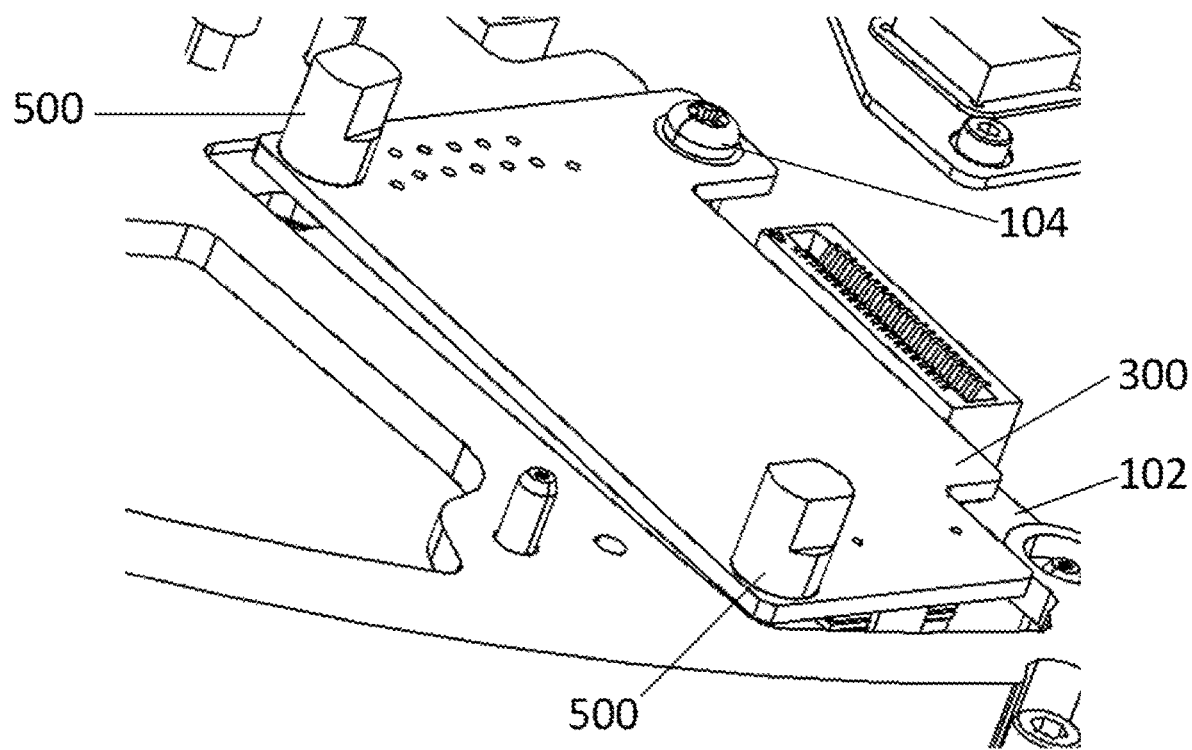

With the first circuit board 300 supported on the recessed surface 205 and the electrical connectors 105 and 305 coupled, the first circuit board 300 may be secured to the chassis 200 by threadedly coupling pins caps 500 with the securing ends 402 of the partially threaded pins 400, as shown for example in FIG. 6E. The first circuit board 300 may further be coupled to the chassis 200 with a screw 104 extending through a through hole 301 of the first circuit board 300 into a hole 201 of the chassis 200, as shown for example in FIG. 6F.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A method of coupling a first circuit board to a chassis and to a second circuit board, wherein the second circuit board is coupled to the chassis, and wherein a LiDAR assembly comprises the first circuit board, the second circuit and the chassis, the method comprising:
   positioning the first circuit board over the chassis so that a first pin of one or more pins extending from the chassis extends into a first through hole of the first circuit board, wherein the first pin comprises a threaded chassis end threadedly coupled to the chassis, a threaded securing end opposite the threaded chassis end, and an unthreaded central portion between the threaded securing end and the threaded chassis end, wherein the first pin comprises an unthreaded central portion between the threaded securing end and the threaded chassis end, wherein the unthreaded central portion defines a flattened circular cross-section, and wherein a perimeter of the flattened circular cross-section comprises two straight sides and two arced sides;

contacting and coupling a first electrical connector of the first circuit board to a second electrical connector of the second circuit board, wherein the first pin is received into the first through hole prior to the first electrical connector contacting the second electrical connector in order to cause alignment of the first electrical connector and the second electrical connector prior to the coupling of the first electrical connector to the second electrical connector, and wherein the two arced sides are respectively defined by a first radius corresponding to a second radius of the first through hole of the first circuit board so that when engaged with each other the unthreaded central portion limits movement of the first circuit board relative to the first pin in directions perpendicular to a longitudinal axis of the first pin.

2. The method of claim 1, wherein the first circuit board is a galvanometer driver circuit board configured to control a galvanometer of the LiDAR assembly.

3. The method of claim 1, wherein the first connector or the second connector comprises a header socket.

4. The method of claim 1, further comprising:
positioning the first circuit board over the chassis so that a second pin of the one or more pins extending from the chassis extends into a second through hole of the first circuit board to further cause the alignment of the first electrical connector and the second electrical connector prior to the coupling of the first electrical connector to the second electrical connector.

5. The method of claim 4, further comprising:
securing the first circuit board to the chassis with a screw extending through a third through hole of the first circuit board into the chassis, after the first electrical connector is coupled to the second electrical connector.

6. The method of claim 1, wherein the chassis defines a first side, a second side, and an opening between the first side and the second side,
wherein the first side of the chassis faces the first circuit board,
wherein the second side of the chassis faces the second circuit board, and
wherein the second electrical connector does not extend past the first side.

7. The method of claim 6, wherein the chassis defines a recessed surface offset from the first side, and
wherein the one or more pins extend from the recessed surface and extend past the first side.

8. The method of claim 7,
wherein the method further comprises threadedly coupling the threaded chassis end of the first pin to the chassis prior to the step of positioning the first circuit board.

9. The method of claim 8,
wherein the method further comprises threadedly coupling a first pin cap to the threaded securing end of the first pin to secure the first circuit board between the pin cap and the chassis.

10. A LiDAR assembly comprising:
a chassis;
a first circuit board comprising a first electrical connector and a first through hole;
a second circuit board coupled to the chassis and comprising a second electrical connector coupled to the first electrical connector; and
a first pin extending from the chassis through the first through hole of the first circuit board;
wherein the first pin comprises a threaded chassis end threadedly coupled to the chassis, a threaded securing end opposite the threaded chassis end, and an unthreaded central portion between the threaded securing end and the threaded chassis end,
wherein the unthreaded central portion defines a flattened circular cross-section, wherein a perimeter of the flattened circular cross-section comprises two straight sides and two arced sides, wherein the two arced sides are respectively defined by a first radius corresponding to a second radius of the first through hole of the first circuit board so that when engaged with each other the unthreaded central portion limits movement of the first circuit board relative to the first pin in directions perpendicular to a longitudinal axis of the first pin, and
wherein the first pin is configured to be received into the first through hole prior to the first electrical connector being coupled to the second electrical connector in order to cause alignment of the first electrical connector and the second electrical connector prior to the coupling of the first electrical connector to the second electrical connector.

11. The LiDAR assembly of claim 10, wherein the first circuit board is a galvanometer driver circuit board configured to control a galvanometer of the LiDAR assembly.

12. The LiDAR assembly of claim 10, wherein the first connector or the second connector comprises a header socket.

13. The LiDAR assembly of claim 10, further comprising:
a second pin extending from the chassis through a second through hole of the first circuit board,
wherein the first pin and the second pin are configured to be received into the first through hole and the second through hole, respectively, prior to the first electrical connector being coupled to the second electrical connector in order to cause alignment of the first electrical connector and the second electrical connector prior to the coupling of the first electrical connector to the second electrical connector.

14. The LiDAR assembly of claim 13, further comprising:
a screw extending through a third through hole of the first circuit board into the chassis.

15. The LiDAR assembly of claim 10, wherein the chassis defines a first side, a second side, and an opening between the first side and the second side,
wherein the first side of the chassis faces the first circuit board,
wherein the second side of the chassis faces the second circuit board, and
wherein the second electrical connector does not extend past the first side.

16. The LiDAR assembly of claim 15, wherein the chassis defines a recessed surface offset from the first side, and
wherein the first pin extends from the recessed surface and extends past the first side.

17. The LiDAR assembly of claim 16,
wherein the threaded chassis end of the first pin is configured to be threadedly coupled to the chassis prior to the first circuit board being supported by the recessed surface.

18. The LiDAR assembly of claim 17, further comprising a thread pin cap,
wherein the pin cap is threadedly coupled to the securing end of the first pin in order to secure the first circuit board between the pin cap and the chassis.

\* \* \* \* \*